US007772625B2

(12) United States Patent  
Liang et al.

(10) Patent No.: US 7,772,625 B2
(45) Date of Patent: Aug. 10, 2010

(54) IMAGE SENSOR HAVING AN RPO LAYER CONTAINING NITROGEN

(75) Inventors: Yao Hsiang Liang, Shinchu (TW); Wen-Kung Cheng, Toufen Township (TW); Chen-Peng Fan, Sinfong Township (TW); Ming-Hsien Chen, Hsinchu (TW); Richard Chen, Jhubei (TW); Jung-Chen Yang, ChuPei (TW); Wen-Yu Ho, Jhudong Township (TW); Chao-Keng Li, Jhubei (TW); Yong-Sin Chang, Taichung (TW); Labo Chang, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 188 days.

(21) Appl. No.: 11/548,189

(22) Filed: Oct. 10, 2006

(65) Prior Publication Data

US 2008/0083938 A1    Apr. 10, 2008

(51) Int. Cl.  
*H01L 31/09* (2006.01)

(52) U.S. Cl. .................. 257/292; 257/E31.127
(58) Field of Classification Search .................. 257/292  
See application file for complete search history.

(56) References Cited

U.S. PATENT DOCUMENTS 6,876,016 B2   4/2005   Chan

| 6,951,807 B2* | 10/2005 | Watanabe et al. ............ 438/624 |
| 2005/0093036 A1* | 5/2005 | Han ............................ 257/291 |
| 2005/0151055 A1 | 7/2005 | Lavine |
| 2006/0057759 A1 | 3/2006 | Zhang et al. |
| 2006/0121708 A1* | 6/2006 | Lin et al. ..................... 438/583 |

FOREIGN PATENT DOCUMENTS

CN         1750267        3/2006
KR    1020030058276 A     7/2003

OTHER PUBLICATIONS

Liao Zuo-Sheng, et al, The Liquid Source Chemical Vapor Deposition Equipment Used in Making SiO2 Film, Equipment for Electronic Products Manufacturing, Jun. 2003, pp. 55-57. China Academic Journal Electronic Publishing House.

* cited by examiner

*Primary Examiner*—Howard Weiss
*Assistant Examiner*—Tifney L Skyles
(74) *Attorney, Agent, or Firm*—Duane Morris LLP (57) ABSTRACT

A semiconductor structure includes a transistor formed over a substrate. The transistor includes a transistor gate and at least one source/drain region. The semiconductor structure includes a pre-determined region coupled to the transistor. The semiconductor structure further includes a resist protection oxide (RPO) layer formed over the pre-determined region, wherein the RPO layer has a level of nitrogen of about 0.35 atomic % or less.

7 Claims, 8 Drawing Sheets

IMAGE SENSOR HAVING AN RPO LAYER CONTAINING NITROGEN

BACKGROUND OF THE INVENTION

1. Field of the Invention

The present invention relates to semiconductor structures and methods of forming semiconductor structures, and more particularly to image sensors and methods of fabricating image sensors.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chip sets. Further, integrated circuits providing various functions have been assembled or integrated to efficiently serve multiple functions in a single chip. This type of integrated circuit is generally referred to as a "system on chip (SOC)." A complementary metal-oxide-semiconductor (CMOS) image sensor (CIS) is one type of SOC. A CIS includes a CMOS transistor, a color filter, and a photo diode. The photo diode is subjected to a light exposure which generates electron and hole charges. The color filter transmits light in the three primary colors (red, green and blue) to respective detector elements. Voltages are applied to the CMOS transistor, thereby directing the charges generated by the photoelectric effect to a capacitor.

In order to achieve high-integration and high-speed goals, dimensions of semiconductor integrated circuits continue to shrink. Various materials and techniques have been proposed to achieve these integration and speed goals and to overcome manufacturing obstacles associated therewith. In order to reduce resistances of the CMOS transistor, silicide has been formed over the top surface of the transistor gate and source/drain regions. The photo diode coupled to the transistor, however, must be protected from the silicide formation because a silicide layer formed over the photo diode will block the photo diode from a light exposure and adversely affect the photoelectric effect. Accordingly, a resist protection oxide (RPO) layer is formed over the photo diode to protect the photo diode from silicide formation.

Figure 1:
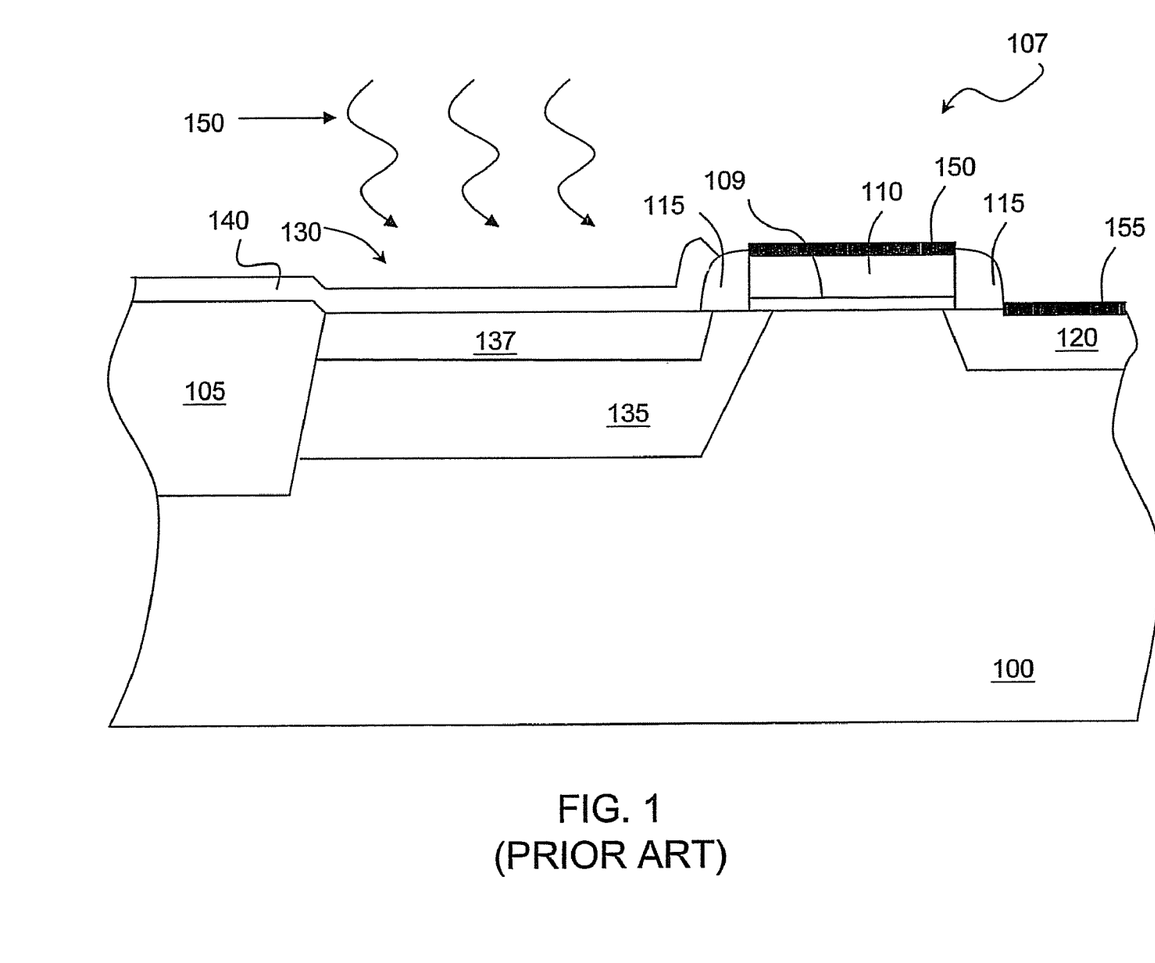
FIG. 1 is a cross-sectional view showing a prior art CIS diode.

FIG. 1A is a cross-sectional view showing a prior art CIS diode. A shallow trench isolation (STI) structure 105 is formed within the substrate 100. The CIS diode comprises a CMOS transistor 107 and a photo diode 130. The CMOS transistor 107 includes a gate oxide layer 109, polysilicon gate 110 and cobalt silicide layer 150 sequentially formed over the substrate 100. The CMOS transistor 107 further includes spacers 115 formed on the sidewalls of the polysilicon gate 110 and a source/drain region 120 formed within the substrate 100 adjacent to the polysilicon gate 110. A silicide layer 155 is formed over the source/drain region 120. The photo diode 130 comprises a p+-type dopant region 135 and an n-type dopant region 137. When the photo diode 130 is subjected to a light exposure 150, the photoelectric effect occurs and electrons and holes (not shown) are generated within the photo diodes. An RPO layer 140 is formed over the photo diode 130 for protecting the photo diode 130 from being silicidized when the silicide layers 150 and 155 are formed over the polysilicon gate 110 and source/drain region 120, respectively.

In a prior art process step, the RPO layer 140 is formed by a chemical vapor deposition (CVD) process step using silane ($SiH_4$) and $N_2O$ as precursors. The CVD process step has an oxide deposition rate of about 40 Å/sec or more. However, white pixels of photo diodes can be found when undesired charges or current leakages are found in the photo diodes. The white pixel failures relate to the structures or film quality of the CIS diode. It may also relate to films covering the CIS diode or process steps performed after the photo diode 130 is formed.

From the foregoing, improved image sensors and methods of forming image sensors are desired.

SUMMARY OF THE INVENTION

In accordance with some exemplary embodiments, a semiconductor structure comprises a transistor formed over a substrate. The substrate comprises a transistor gate and at least one source/drain region. The semiconductor structure comprises a pre-determined region coupled to the transistor. The semiconductor structure further comprises a resist protection oxide (RPO) layer formed over the pre-determined region, wherein the RPO layer has a level of nitrogen of about 0.35 atomic % or less.

In accordance with some exemplary embodiments, a method of forming a semiconductor structure is provided. A transistor is formed over a substrate. The transistor comprises a transistor gate formed over the substrate and at least one source/drain region formed adjacent to the transistor gate. A resist protection oxide (RPO) layer is formed over a pre-determined region coupled to the transistor, wherein the PRO layer has a level of nitrogen of about 0.35 atomic % or less.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2D are schematic cross-sectional views of a process for formation of an exemplary image sensor with a silicide structure.

Figure 2A:
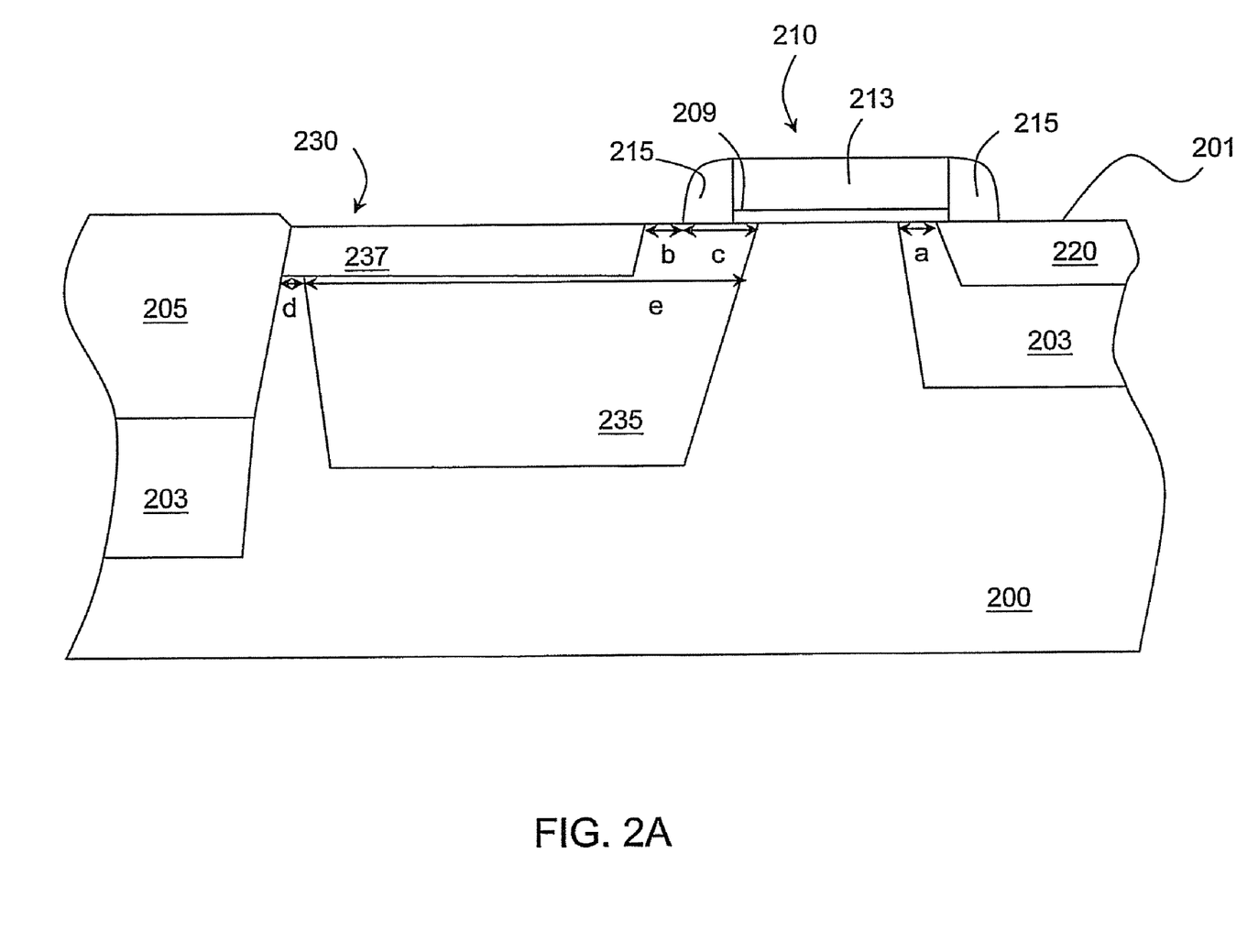
FIGS. 2A-2D are schematic cross-sectional views of a process for formation of an exemplary image sensor with a silicide structure.

As shown in FIG. 2A, P-well regions 203 are formed within a substrate 200. An isolation structure, such as isolation structure 205, is formed within the substrate 200. A transistor 210 is formed over the substrate 200, comprising a transistor gate 213 and at least one source/drain region 220. The transistor gate 213 is formed over the substrate 200. A gate dielectric layer 209 is formed between the transistor gate 213 and the substrate 200. Spacers 215 are formed on the sidewalls of the transistor gate 213 and gate dielectric layer 209. A conductive region, e.g., source/drain region 220, is formed within the substrate 200 and adjacent to the transistor gate 213. A pre-determined region, such as a photo diode region 230, is defined and coupled to the transistor 210. The photo diode region 230 comprises an N-type photo sensor (NPS) region 235 and a P-type photo sensor (PPS) region 237.

The substrate 200 may be a P-type or N-type silicon substrate, III-V compound substrate, display substrate such as a liquid crystal display (LCD), plasma display, electro luminescence (EL) lamp display, or light emitting diode (LED) substrate (collectively referred to as, substrate 200), for example. The isolation structure 205 may comprise, for example, a shallow trench isolation (STI) structure, field oxide structure or other isolation structure that is able to isolate adjacent transistors, diodes or circuits. The isolation structure 205 may comprise, for example, a dielectric layer, such as an oxide layer, nitride layer, oxynitride layer, combinations thereof, or the like which may be formed by a chemical vapor deposition (CVD) process step. In some embodiments using STI structures, the dielectric layer may be formed by a high density plasma CVD (HDP CVD) process step.

The P-well regions 203 may be formed by, for example, an ion implantation process step. In some embodiments, the ion implantation process step uses P-type dopants, such as boron (B) or other elements of group II or III of the periodic table. For embodiments using 0.18-µm technology, the ion implantation process step may have a dosage of the P-type dopant of about $1.5 \times 10^4/cm^2$ and an implantation energy of about 160 KeV.

The source/drain region 220 may be formed by, for example, another ion implantation process step. The source/drain region 220 is coupled to a capacitor region (not shown) which is provided to store charges generated from the photo diode region 230 when the photo diode region 230 is subjected to a light exposure. This ion implantation process step may use N-type dopants, such as phosphorus (P), arsenic (As) or other elements of group V or VI of the periodic table.

The gate dielectric layer 209 may comprise, for example, an oxide layer, nitride layer, oxynitride layer, a high-k dielectric material layer or other dielectric material that is able to isolate the transistor gate 213 from the substrate 200. The gate dielectric layer 209 may be formed by, for example, a CVD process step, thermal oxidation process step or other semiconductor process step that is capable of forming a dielectric layer. The transistor gate 213 may comprise, for example, a polysilicon layer, metal-containing layer, combinations thereof, or other conductive layer that is able to serve as a transistor gate. The transistor gate 213 may be formed by, for example, a CVD process step, physical vapor deposition (PVD) process step, thermal process step or other semiconductor process step that is able to form the transistor gate 213. The spacers 215 may comprise, for example, oxide spacers, nitride spacers, oxynitride spacers, combinations thereof or other dielectric spacers that is suitable to protect the sidewalls of the transistor gate 213 and/or form the profile of the source/drain region 220. The spacers 215 may be formed by, for example, a CVD process step, thermal process step or other semiconductor process step that is able to form a dielectric layer.

The NPS regions 235 may be formed by, for example, an ion implantation process step. In some embodiments, the ion implantation process step may use N-type dopants, such as phosphorus (P), arsenic (As) or other dopants of group V or VI of the periodic table. For embodiments using 0.18-µm technology, this ion implantation process step may have a dosage of the N-type dopant of about $1.1 \times 10^{13}/cm^2$ and an implantation energy of about 400 KeV.

The PPS regions 237 may be formed by, for example, an ion implantation process step. In some embodiments, the ion implantation process step may use P-type dopants, such as boron (B) or other elements of group II or III of the periodic table. For embodiments using 0.18-µm technology, this ion implantation process step may include a dosage of the P-type dopants of about $3 \times 10^{14}/cm^2$ and an implantation energy of about 15 KeV. These ion implantation dosages and energy set forth above relate to the feature dimensions of devices formed over the substrate 200. One of ordinary skill in the art can readily modify these implantation conditions to achieve a desired implantation profile in a semiconductor structure.

In some embodiments, the photo diode region 230 may be coupled to the transistor 210 through the NPS region 235 as shown in FIG. 2A. In this figure, an edge of the photo diode region 230, e.g., the edge of the NPS region 235, is adjacent to and under the transistor gate 213. In other embodiments, the transistor 210 may comprise another source/drain region 220a (as shown in FIG. 2E) formed between the photo diode region 230 and the transistor gate 213. In these embodiments, the photo diode region 230 may be coupled to the transistor 210 via the source/drain region 220a (as shown in FIG. 2E). The image sensor, e.g., the photo diode region 230 shown in FIG. 2A, has larger dimensions than those of the image sensor, e.g., the photo diode region 230 shown in FIG. 2E, if the CMOS image sensors (CIS) shown in FIGS. 2A and 2E have the same dimensions.

For some embodiments using 0.18-µm technology, a length "a" of the P-well region 203 under the transistor gate 213 at the top surface 201 of the substrate 200 is about 0.1 µm; a length "b" from the edge of the spacer 215 to the edge of the PPS region 237 at the top surface 201 of the substrate 200 is about 0.3 µm; a length "c" from the edge of the spacer 215 to the edge of the NPS region 235 under the transistor gate 213 at the top surface 201 of the substrate 200 is about 0.5 µm; a length "d" from the edge of the isolation structure 205 to another edge of the NPS region 235 at the interface between the NPS region 235 and PPS region 237 is about 0.2 µm; and a length "e" from one edge of the NPS region 235 to another edge of the NPS region 235 at the interface between the NPS region 235 and PPS region 237 is between about 2.1 µm and about 2.3 µm.

Figure 2B:
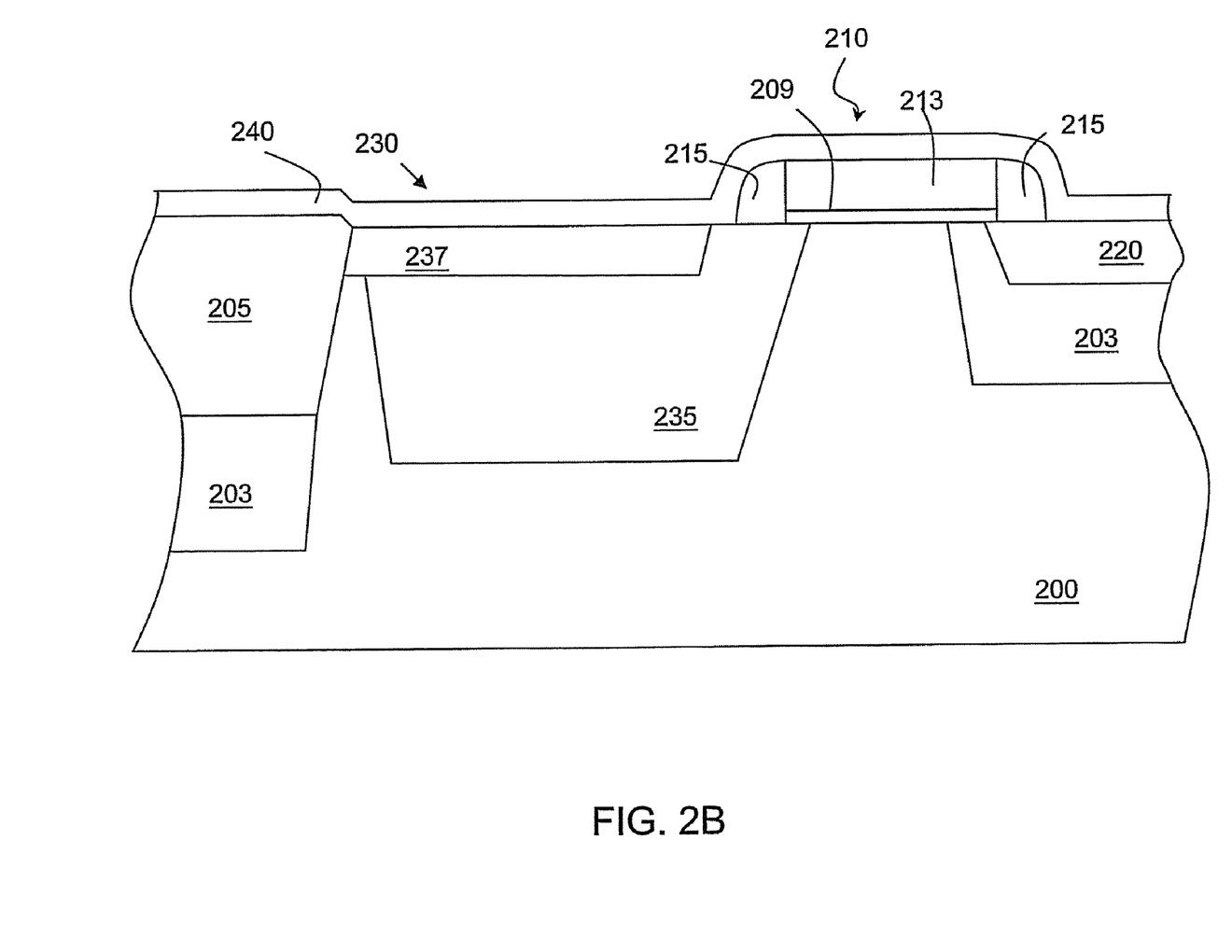
Figure 2C:
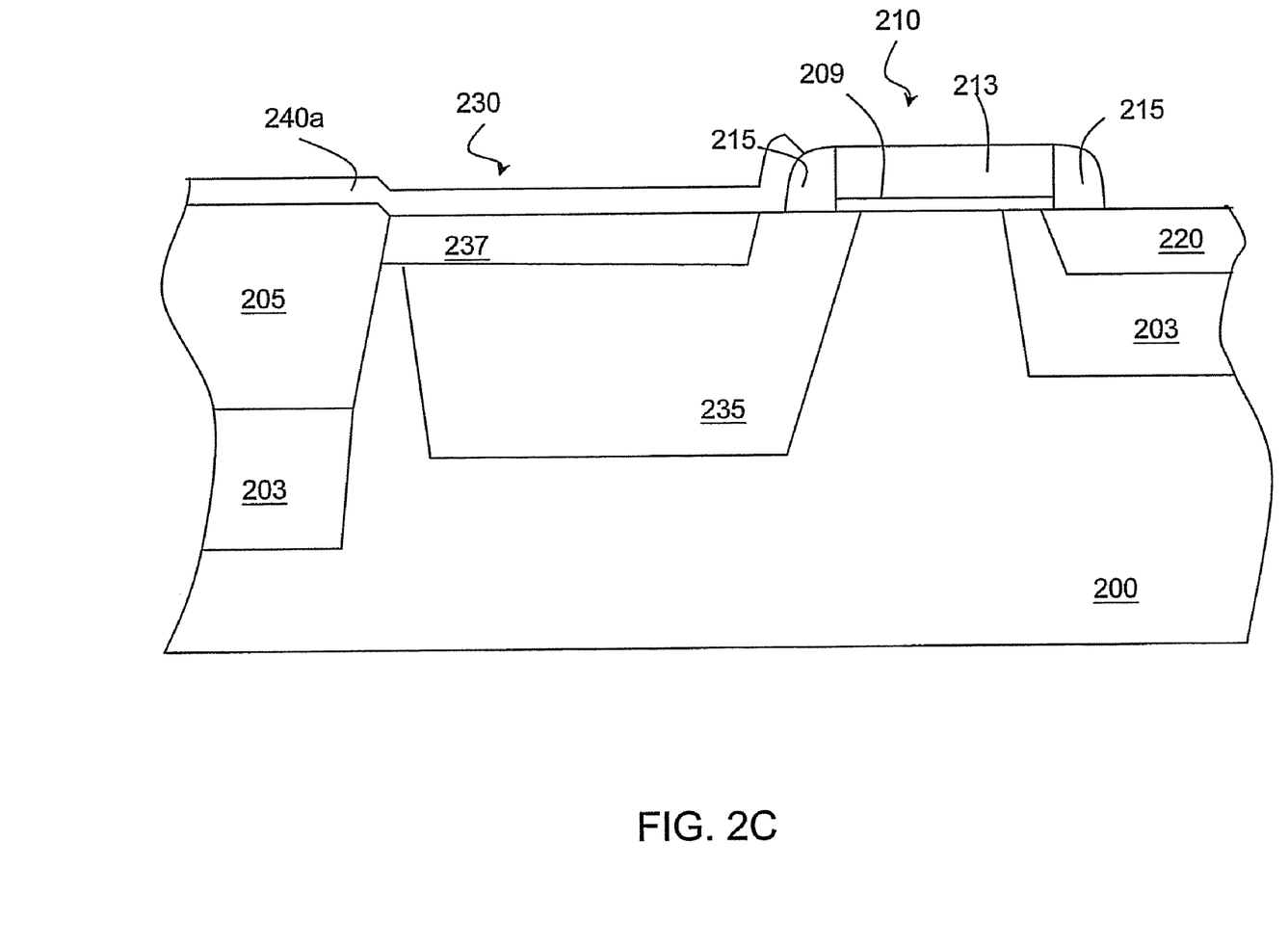

As shown in FIG. 2B, a substantially conformal resist protection oxide (RPO) layer 240 is formed over the isolation structure 205, PPS region 237, spacers 215, transistor gate 213 and source/drain region 220. The RPO layer 240 may comprise, for example, a dielectric layer that protects a pre-defined substrate region thereunder from silicidation or other dielectric layer that directly contacts a pre-defined substrate region in which electrical transmission, e.g., current, occurs. The RPO layer 240 has a level of nitrogen component of about 0.35 atomic % or less. It is founded that a desired level of nitrogen contained within the RPO layer 240 may effectively reduce or prevent white pixel failures as described below.

Further, a desired film quality of the RPO layer 240 may also be detected by measuring the refractive index (RI) as shown below. Detailed descriptions are provided below.

Following is a description of an exemplary method of forming the RPO layer 240 without using a nitrogen-containing precursor.

In some embodiments, the RPO layer 240 may be formed by, for example, a CVD (e.g., atmospheric pressure CVD (APCVD) process step, sub-atmospheric pressure CVD (SACVD) process step or low pressure CVD (LPCVD) process step). The CVD process step may use precursors such as, for example, tetraethoxysilane (TEOS) or silane-based chemical (e.g., $SiH_4$ or $SiH_2Cl_2$) and oxygen ($O_2$), ozone ($O_3$) or other oxygen-containing chemical that is nitrogen free. An exemplary chemical reaction of the precursors is shown as below:

$$Si(OC_2H_5)_4 + O_2 \rightarrow SiO_2 + \text{byproduct}$$

Figure 2D:
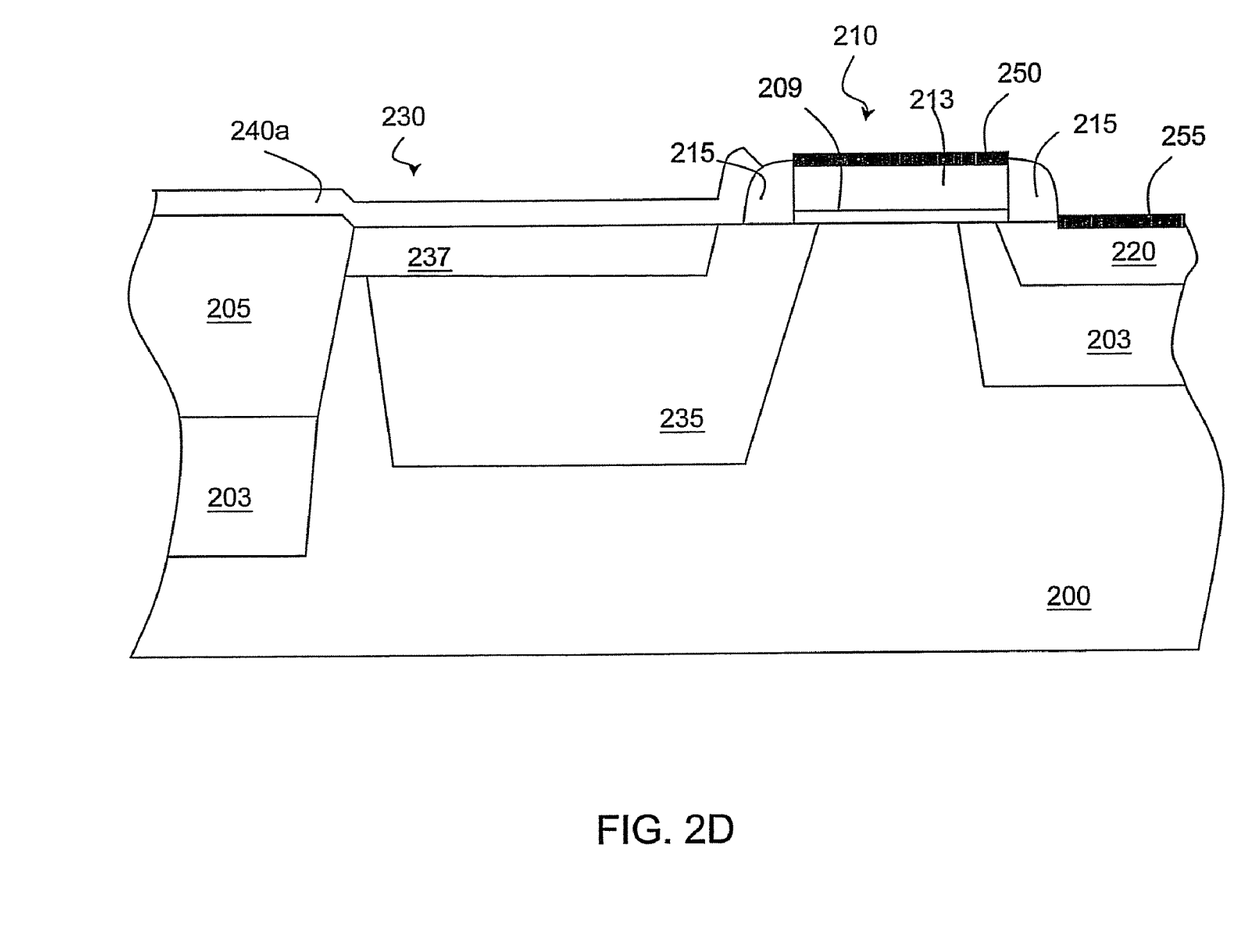
Figure 2E:
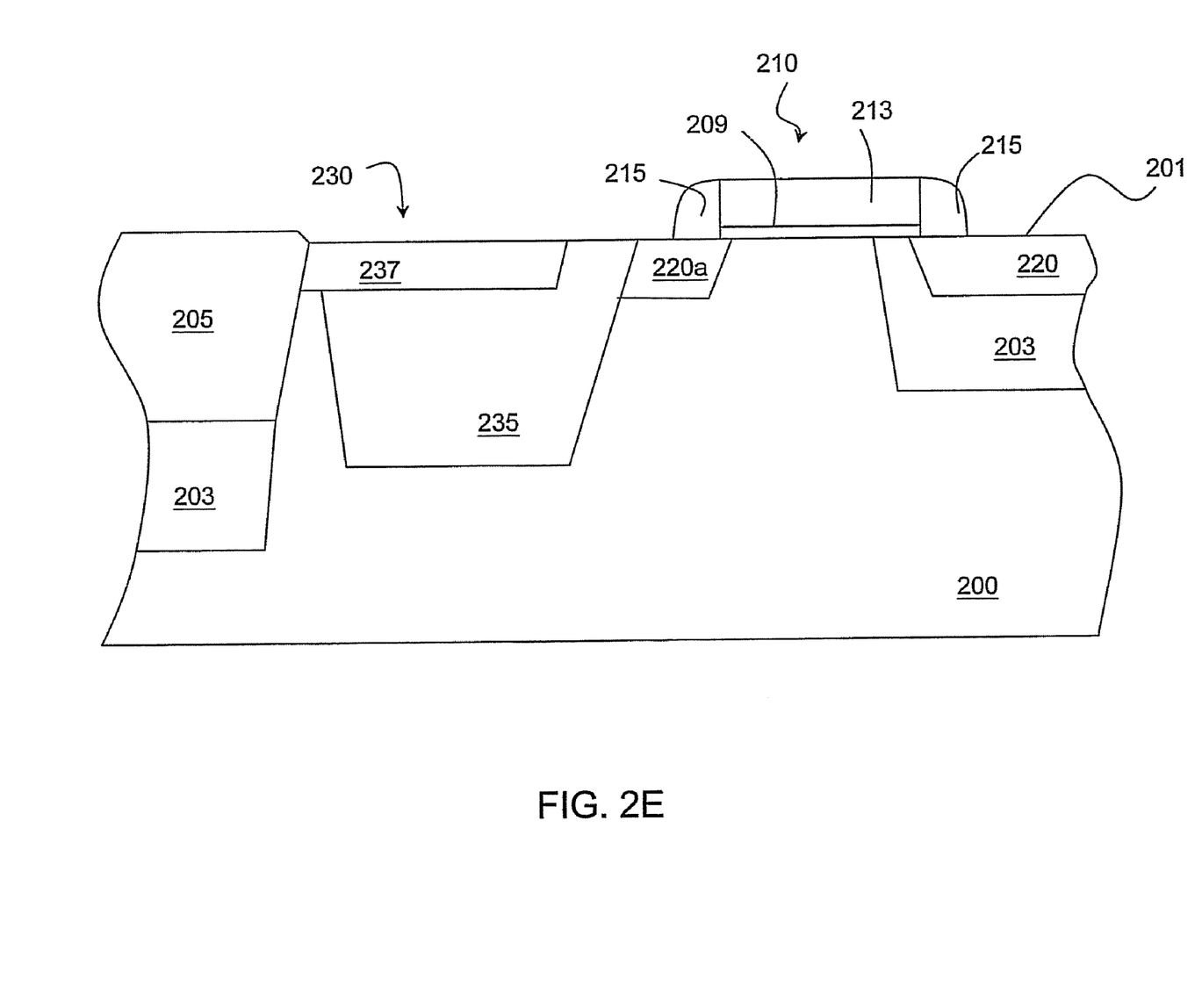
FIG. 2E is a schematic cross-sectional view of another exemplary image sensor.

The RPO layer 240 may comprise, for example, an undoped silicate glass (USG) layer, high density USG (HUSG) or other dielectric layer that can protect the photo diode region 230 from being silicidized as shown in FIG. 2D and does not substantially react with the photo diode region 230, e.g. the PPS region 237. For an embodiment using 0.18-μm technology, the RPO layer 240 has a thickness between about 350 Å and about 850 Å.

In some embodiments, the CVD process step comprises a TEOS flow rate between about 300 standard cubic centimeters per minute (sccm) and about 1,100 sccm, preferably about 900 sccm; and an oxygen flow rate between about 900 sccm and about 1,800 sccm, preferably about 1,000 sccm. The CVD process step may also use a carrier gas, such as He or other gas that is not substantially involved in the chemical reaction of the formation of the RPO layer 240. The carrier gas may have a flow rate of about 1,000 sccm. The CVD process step may have a processing pressure between about 6 Torrs and about 9 Torrs, preferably about 8.2 Torrs and a processing power between about 400 Watts and about 1,000 Watts, preferably about 910 watts.

In some embodiments, the precursors provided for the formation of the RPO layer 240 do not include a substantial amount of any nitrogen-containing precursor (e.g., $N_2$, NO, $N_2O$, $NO_2$, combinations thereof or the like). The RPO layer 240 thus is substantially nitrogen-free. With the substantially nitrogen-free property, the CIS having the RPO layer 240 formed thereover has a low level of white pixel failures. For these embodiments, the TEOS-RPO layer 240 formed by the process step set forth above may be deposited at a high deposition rate, e.g., about 20 Å/second or more, or at a low deposition, e.g., between about 5 Å/second and about 20 Å/second. Since a nitrogen-free precursor is used for forming the RPO layer 240, the deposition rate of the CVD process step does not affect the level of nitrogen contained within the RPO layer 240. Therefore, the deposition rate of the RPO layer 240 can be changed in a wide range between about 5 Å/second and about 200 Å/second. The deposition rate of the RPO layer 240 can be increased, if the increased deposition rate does not adversely affect the control of the desired thickness. For example, the deposition rate, e.g., 200 Å/second, is too high to achieve a desired thickness, e.g., 200 Å, because the processing time is only about two seconds.

Following is a description of another exemplary method of forming the RPO layer 240 with a nitrogen-containing precursor.

For these embodiments, the precursors provided for the formation of the RPO layer 240 may comprise, for example, a silane-based chemical (e.g., $SiH_4$ or $SiH_2Cl_2$) and nitrogen-containing chemical (e.g. $N_2O$, NO or $NO_2$). An exemplary chemical reaction of the precursors is shown as below:

$$SiH_4 + N_2O \rightarrow SiO_2 + \text{byproduct}$$

Since $N_2O$ is provided as a precursor in the chemical reaction, the RPO layer 240 formed therefrom may comprise a nitrogen component. In order to control the nitrogen level contained within the RPO layer 240 as described above, the CVD process step deposits the RPO layer 240 at a deposition rate of about 20 Å/second or less. In some preferred embodiments, the deposition rate of the RPO layer 240 is about 10 Å/second. Since the low deposition rate of the RPO layer 240 may provide more time for nitrogen components to be released from N—O bonding (where oxygen will engage with Si provided from silane), the level of nitrogen contained within the RPO layer 240 is, therefore, reduced.

For example, the CVD process step may use the precursors $SiH_4$ and $N_2O$, which have flow rates of about 12 standard cubic centimeters per minute (sccm) or less and of about 450 sccm or less, respectively. The CVD process step may also use a carrier gas, such as He or other gas that is not substantially involved in the chemical reaction of the formation of the RPO layer 240. The carrier gas may have a flow rate of about 1,000 sccm, for example. The CVD process step may also have a processing pressure of about 5.5 Torrs, processing power of about 100 watts and processing temperature of about 400° C. or less. In some embodiments, in order to lower the deposition rate of the RPO layer 240 to about 20 Å/second or less, the flow rates of $SiH_4$ and $N_2O$ set forth above are reduced.

As shown in FIG. 2C, a portion of the RPO layer 240 is removed so that the top surface of the transistor gate 213 and the top surface of the source/drain region 220 are exposed. The remaining RPO layer 240a covers the photo diode region 230, e.g., the PPS region 237 and NPS region 235. The RPO layer 240a does not substantially react with a metal-containing layer (not shown) that is provided to form the silicide layers 250 and 255 at the top surfaces of the transistor gate 213 and source/drain region 220, respectively, as shown in FIG. 2D. Accordingly, the metal-containing layer is not attached to the top surfaces of the PPS and NPS regions 237 and 235, respectively. The photo diode region 230 thus receives energy from a light exposure.

The process step of removing the portion of the RPO layer 240 may comprise, for example, a photolithographic process step and an etch process step. For example, a patterned photoresist layer (not shown) is formed by a photolithographic process step over the RPO layer 240 as shown in FIG. 2B corresponding to the pattern of the RPO layer 240a shown in FIG. 2C. An etch process step using the patterned photoresist layer as a mask is performed to remove a portion of the RPO layer 240, which is not covered by the patterned photoresist layer to expose the top surface of the transistor gate 213 and the top surface of the source/drain region 220 upon which silicide layers 250 and 255 are formed as shown in FIG. 2D. After the etch process step, the patterned photoresist layer (not shown) is removed by, for example, a photoresist removal process step.

As shown in FIG. 2D, the silicide layers 250 and 255 are formed over the transistor gate 213 and source/drain region 220, respectively. The silicide layers 250 and 255 may comprise, for example, tungsten silicide layers, cobalt silicide layers, nickel silicide layers or other silicide layers that are provided to reduce the resistances of the transistor gate 213 and source/drain region 220.

Following is a description of the formation of the silicide layers 250 and 255. For some embodiments, a metallic layer (not shown), such as tungsten, cobalt, nickel or other metal-containing layer that is able to react with the transistor gate 213 and source/drain region 220 to form the silicide layers 250 and 255, respectively, is formed over the structure shown in FIG. 2C. The metal-containing layer may be formed by, for example, a physical vapor deposition (PVD) process step or CVD process step. The metal-containing layer thus is formed over the RPO layer 240a, spacers 215, transistor gate 213 and source/drain region 220. After the deposition of the metal-containing layer, a thermal process step is performed so that the metal-containing layer reacts with the top surfaces of the transistor gate 213 and source/drain region 220. It is not necessary to form a silicide layer over the RPO layer 240a and spacers 215, because the metal-containing layer does not substantially react with dielectric materials, such as oxide, nitride or oxynitride. With the RPO layer 240a present, the photo diode region 230 (e.g., the PPS and NPS regions 237 and 235, respectively) formed thereunder is protected from the formation of silicide. As set forth above, the photo diode region 230 is provided for generating charges based on a photoelectric effect when the photo diode region 230 is subjected to a light exposure. A silicide layer formed over the photo diode region 230 would adversely affect the efficiency of photoelectric effect.

Following is the description of the relations among the level of nitrogen, refractive index and white pixel failure. Table 1 shows refractive indexes (RI) of various RPO layers and levels of nitrogen contained within these RPO layers.

the level of nitrogen in the RPO layer is lower. The RPO layers of the wafers 2 and 5 have the highest RI and nitrogen level, and the worst white pixel failures. Also, RPO layers of the wafers 3, 4 and 6 having RI and nitrogen levels higher than those of the wafer 1, have undesired white pixel failures.

Figure 3:
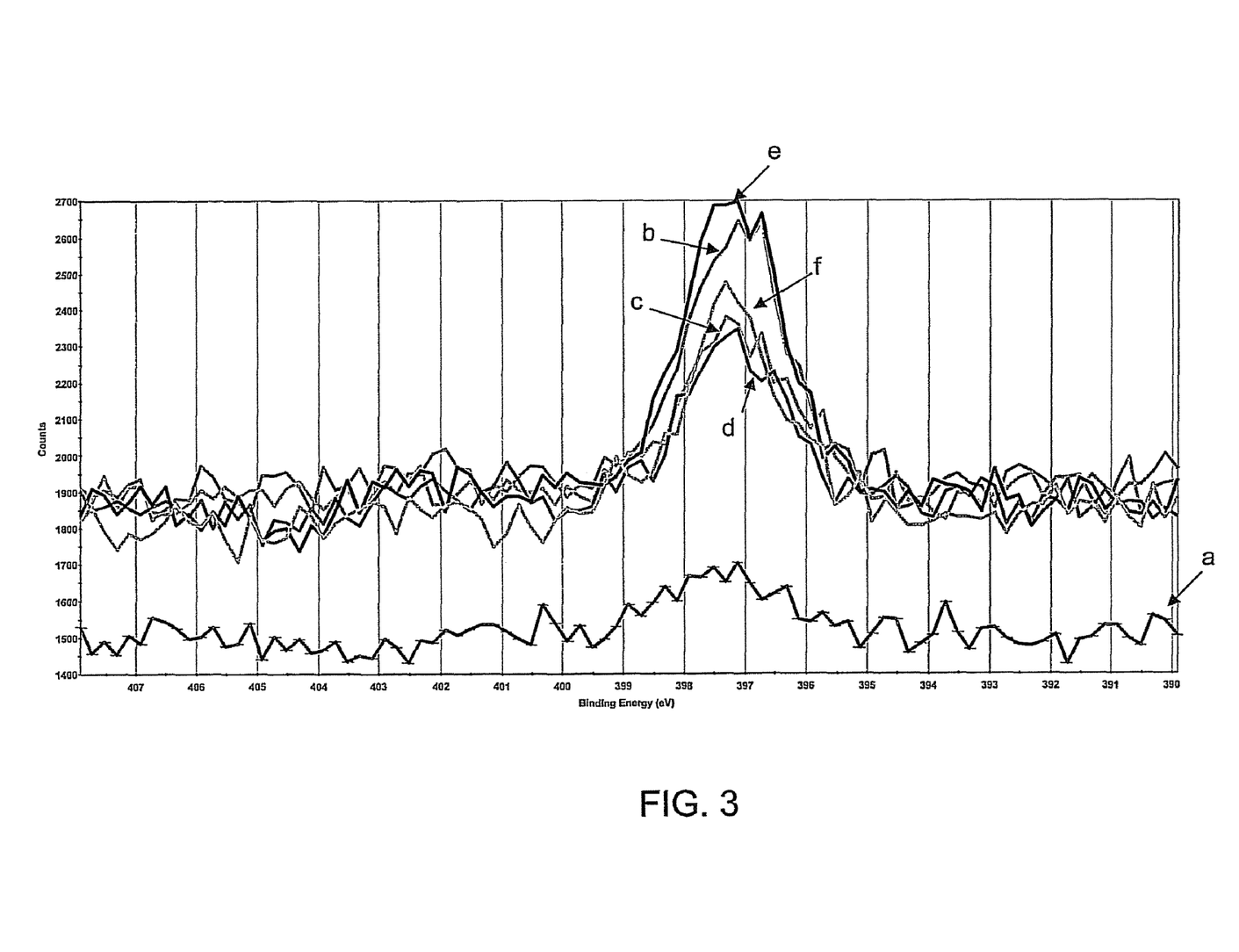
FIG. 3 is an XPS spectrum showing film characteristics of RPO layers formed over wafers under various deposition conditions.

The level of nitrogen contained in each of the RPO layers formed over the wafers 1-6 are measured by an X-ray photo-electron spectroscopy (XPS) as shown in FIG. 3. Curve "a" represents the film property of the wafer 1; curves "b-f" represent film properties of the wafers 2-6, respectively. Signal peaks falling at the binding energy between 397-398 eV indicate the level of H—Si—N bonding within the RPO layer. If the signal shifts right (i.e., toward lower energy), it indicates that more Si—N bonds (i.e., less Si—H bonds) are formed within the RPO layer. On the other hand, if the signal shifts left (i.e., toward the high energy), it indicates that more H—Si bonds (i.e., fewer Si—N bonds) are formed within the RPO layer. As shown in FIG. 3, the signal peak corresponding to H—Si—N bonds in curve "a" is substantially lower than the peaks of curves "b-f," though the RPO layer still comprises a slight level of nitrogen (due to the use of $N_2O$ as a precursor).

Figure 4:
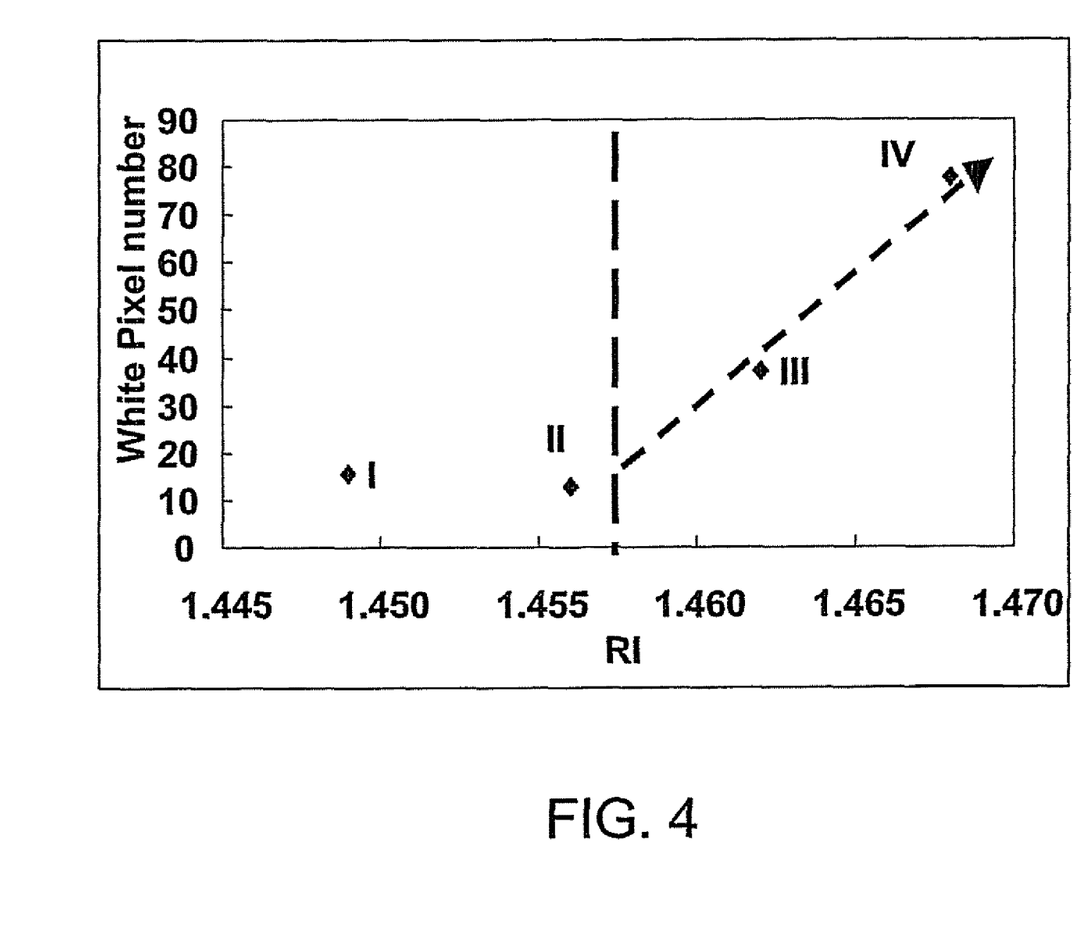
FIG. 4 is a schematic drawing showing a relation between RI and white pixel number of RPO layers.

FIG. 4 shows a relation between RI and white pixel numbers of RPO layers. Points "I" and "II" represent RPO layers formed over wafers by CVD process steeps with deposition rates (e.g., $\leq$20 Å); points "III" and "IV" represent RPO layers formed over wafers by CVD process steps with deposition rates (e.g., $\geq$40 Å). These RPO layers are formed by

| | Wafer # | | | | | |
|---|---|---|---|---|---|---|
| | 1 | 2 | 3 | 4 | 5 | 6 |
| Condition | Low deposition rate ($\leq$20 Å/sec) | Worst RI and worst white pixel rate | Worse RI and worse white pixel rate | Deposition rate ($\geq$40 Å/sec); worse white pixel rate | Worst equipment; worst white pixel rate | worse equipment; worse white pixel rate |
| Refractive Index | 1.45 | 1.465 | 1.459 | 1.46 | 1.4665 | 1.459 |
| Nitrogen level atomic % | 0.3 | 0.83 | 0.52 | 0.64 | 1.1 | 0.68 |

Except for the process steps of forming RPO layers, test structures are formed over wafers 1-6 in accordance with the process steps set forth in connection with FIGS. 2A-2D. Each of these RPO layers is formed by a CVD process step using $SiH_4$ and $N_2O$ as precursors. As shown in this table, the RPO layer formed over the wafer 1 is formed by a CVD process step with a deposition rate of about 20 Å/sec or less. The RPO layers formed over the wafers 2-6 are formed by CVD process steps with deposition rates of about 40 Å/sec or more. The wafers 2 and 3 were processed in randomly selected chambers; the wafer 4 was processed within a normally-operated chamber; the wafer 5 was processed within a chamber having a worst equipment condition, compared with the chamber used for forming the wafer 4; and the wafer 6 was processed within a chamber having a worse equipment condition, compared with the chamber used for forming the wafer 5. These RPO layers are also subjected to a refractive index test. Among these RPO layers, the RPO layer formed over the wafer 1 has the level of nitrogen and refractive index lower than those of RPO layers formed over the wafers 2-6. Based on Table 1, the refractive index of the RPO layer is lower, if CVD process steps using $SiH_4$ and $N_2O$ as precursors. As shown in FIG. 4, the photo diode region has a lower white pixel number, if the RI of the RPO layer is lower. In some embodiments, the RI of the RPO layer is about 1.457 or less in correspondence to the desired film quality of the RPO layer which is formed over the photo diode region.

From the foregoing, a low level of nitrogen component contained in an RPO layer may effectively reduce or prevent white pixel failures of a photo diode formed thereunder. The desired film quality of the RPO layer may further be investigated by a refractive index test based on the relations among the level of nitrogen contained within the RPO layer, the refractive index of the RPO layer and the white pixel failures as set forth above.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A semiconductor image sensor structure, comprising:
   a transistor formed over a substrate, the transistor comprising a transistor gate and at least one conductive region;
   a photodiode region coupled to the transistor and comprising an N-type photo sensor region and a P-type photo sensor region; and
   a resist protection oxide (RPO) layer formed over the photodiode region, wherein the RPO layer is formed of a nitrogen-containing material having a level of nitrogen of 0.3 atomic % or less but greater than 0 atomic %.

2. The semiconductor structure of claim 1, wherein the RPO layer comprises a tetraethoxysilane (TEOS) layer.

3. The semiconductor structure of claim 1, wherein the RPO layer has a refractive index of about 1.457 or less.

4. The semiconductor structure of claim 1, wherein the RPO layer comprises an undoped silicate glass (USG) layer.

5. The semiconductor structure of claim 1, wherein the RPO layer has a thickness between about 350 Å and about 850 Å.

6. The semiconductor structure of claim 1, wherein the pre-determined region comprises a photo diode region.

7. A semiconductor image sensor structure, comprising:
   a transistor formed over a substrate, the transistor comprising a transistor gate and at least one conductive region;
   a photo diode region coupled to the transistor and comprising an N-type photo sensor region and a P-type photo sensor region; and
   a resist protection oxide (RPO) layer formed over the photo diode region, the RPO layer being formed of a material having a refractive index of less than 1.46 and containing nitrogen present at a level of 0.3 atomic % or less but greater than 0 atomic %.

* * * * *